United States Patent
Aksin et al.

(10) Patent No.: US 7,385,440 B2
(45) Date of Patent: Jun. 10, 2008

(54) BOOTSTRAPPED SWITCH FOR SAMPLING INPUTS WITH A SIGNAL RANGE GREATER THAN SUPPLY VOLTAGE

(75) Inventors: Devrim Y. Aksin, Dallas, TX (US); Mohammad A. Al-Shyoukh, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/280,644

(22) Filed: Nov. 16, 2005

(65) Prior Publication Data

US 2006/0202736 A1 Sep. 14, 2006

Related U.S. Application Data

(60) Provisional application No. 60/659,705, filed on Mar. 8, 2005.

(51) Int. Cl.
*H03K 17/10* (2006.01)
*H03M 1/00* (2006.01)

(52) U.S. Cl. ...................... 327/589; 327/390
(58) Field of Classification Search ............ None
See application file for complete search history.

(56) References Cited

U.S. PATENT DOCUMENTS

| | | | |
|---|---|---|---|
| 6,977,544 B2* | 12/2005 | Nicollini et al. ............ | 327/589 |
| 7,049,877 B2* | 5/2006 | Clara et al. ................. | 327/333 |
| 2005/0258874 A1* | 11/2005 | Kudo ........................... | 327/91 |
| 2006/0202735 A1* | 9/2006 | Aksin et al. ................ | 327/390 |
| 2006/0202742 A1* | 9/2006 | Aksin et al. ................ | 327/536 |

* cited by examiner

*Primary Examiner*—Kenneth B. Wells
*Assistant Examiner*—Terry L. Englund
(74) *Attorney, Agent, or Firm*—Alan K. Stewart; W. James Brady; Frederick J. Telecky, Jr.

(57) ABSTRACT

A bootstrapped circuit for sampling inputs with a signal range greater than supply voltage includes: a bootstrapped switch coupled between an input node and an output node; a first transistor coupled to a control node of the bootstrapped switch; a first capacitor having a first end coupled to the first transistor; a second transistor coupled between the first transistor and a supply node, and having a control node coupled to a first clock signal node; a third transistor coupled between the first transistor and the supply node; a charge pump having an output coupled to a control node of the third transistor; a level shifter coupled to a second end of the first capacitor; a fourth transistor coupled between the supply node and a control node of the first transistor; and a fifth transistor coupled between the control node of the fourth transistor and the output of the charge pump and, having a control node coupled to the supply node; wherein the second end of the first capacitor can be charged to an input voltage.

20 Claims, 2 Drawing Sheets

BOOTSTRAPPED SWITCH FOR SAMPLING INPUTS WITH A SIGNAL RANGE GREATER THAN SUPPLY VOLTAGE

This application claims priority under 35 USC § 119 (e)(1) of provisional application No. 60/659,705 filed Mar. 8, 2005.

FIELD OF THE INVENTION

The present invention relates to electronic circuitry and, in particular, to a bootstrapped switch for sampling inputs with a signal range greater than supply voltage.

BACKGROUND OF THE INVENTION

Highly integrated power management applications often require the ability to measure voltage quantities that exceed the supply voltage in magnitude. This is primarily due to a basic need to maximize efficiency by running the power management IC with the lowest supply voltage possible, while still maintaining the ability to sample and measure quantities from the surroundings that could well exceed the battery voltage.

In today's highly integrated power management applications, a low power successive approximation register (SAR) analog-to-digital converter (ADC) is usually present to monitor on-chip and off-chip voltage quantities. The need often arises to extend the on-chip ADC range to sample voltage inputs that are greater than the power supply value. The ADC has to run on the lowest battery voltage possible while still maintaining the ability to sample inputs beyond the supply range.

The most widely used prior art bootstrap circuit in ADC applications is shown in FIG. 1. The circuit of FIG. 1 includes transistors MN1-MN10, MP1, and MP2; inverter INV; capacitors C1, C2, and C3; input node IN; output node OUT; clock signal nodes PHI and PHIZ; and source voltage $V_{DD}$. NMOS transistor MN1 connected to terminal OUT is the bootstrapped switch. A sampling capacitor (not shown) connects between terminal OUT and ground. This circuit is widely used in pipelined ADC converters to increase the bandwidth of the track and hold circuit at the front end of the converter. Most pipelined ADC converters typically have relatively small fully differential ranges that fall well within the supply range of the chip. As a result, the prior art switch presented in FIG. 1 will do the job just fine.

The circuit of FIG. 1 operates as follows. First consider the charge pump formed by transistors MN8, MN9, capacitors C1 and C2, and the inverter INV. It works as follows, assume that initially the voltage across the capacitors C1 and C2 is zero, when the clock signal PHIZ goes high, the top plate of capacitor C1 goes to supply voltage $V_{DD}$ and since the bottom plates of capacitors C2 and C3 are grounded for this state, those capacitors are charged till their top plates reach voltage $V_{DD}-V_{tn}$ (where $V_{tn}$ is the threshold voltage for NMOS transistors MN9 and MN10). When the clock signal PHIZ goes low, the top plate of capacitor C2 is pushed well above voltage $V_{DD}$ (or $2V_{DD}-V_{tn}$ to be exact) yielding complete charging of capacitor C1 to $V_{DD}$ through the switch MN8. With the next phase when PHIZ goes high again, since capacitor C1 is charged to $V_{DD}$, the top plate of capacitor C1 will be pushed to $2V_{DD}$ (two times voltage $V_{DD}$) and capacitors C2 and C3 will be completely charged to $V_{DD}$. In steady state, capacitors C1, C2, and C3 will be charged to $V_{DD}$ and the voltage on the top plates of capacitors C1 and C2 will change between $V_{DD}$ and $2V_{DD}$. The classical bootstrapped switch reaches its steady state after at least one clock period.

Under the assumption that all the capacitors are charged to $V_{DD}$, the bootstrapped switch operates as follows: when PHIZ goes high, the bottom plate of capacitor C3 is grounded and switch MN10 is on, hence capacitor C3 is charged to $V_{DD}$; switch MP2 is also on, driving the gate of transistor MP1 to $V_{DD}$, hence transistor MP1 is off and finally transistor MN6 is on and grounds the gate terminal of the main switch MN1. Since their gate terminal is grounded, transistors MN3, MN2, and MN1 are off. During this phase, the switch MN1 disconnects the input node IN from the output node OUT and capacitor C3 is charged to $V_{DD}$. When PHIZ goes low, since transistor MN6 is off, the gate terminal of MN1 becomes high impedance. Initially, the bottom plate of capacitor C3 is floating, but because of the fact that switch MN4 connects capacitor C3 between the gate and source terminal of transistor MP1, this transistor turns on immediately and the charge stored on capacitor C3 starts flowing to the gate terminal of main switch MN1. While the gate voltage of switch MN1 rises, transistor MN2 turns on and forces the bottom plate of capacitor C3 towards the input voltage VIN, which pushes the top plate of capacitor C3 to voltage $V_{DD}$+VIN. Eventually this voltage appears at the gate of transistor MN1 and as a result transistor MN1 turns on completely to connect the input terminal IN to the output terminal OUT. Transistor MN2 turns on completely to connect input terminal IN to the bottom terminal capacitor C3 and transistor MN3 turns on completely to drive the gate of transistor MP1 to the input voltage level. The gate-to-source voltages of all these four switches MN1, MN2, MN3 and MP1, are all equal to $V_{DD}$. An important detail about device reliability is the following: even though the bootstrapped switch can be turned on by pulling the gate terminal of MP1 to ground, if the input signal is equal to $V_{DD}$ then the voltage difference between the gate and source of transistor MP1 would be $2V_{DD}$. For this reason, during the phase the bootstrapped switch is turned on, the gate voltage on transistor MP1 is forced to the input signal through the switch MN3 so that the gate-to-source voltage of transistor MP1 is bounded within $V_{DD}$, and hence the reliability is enhanced. The main challenge of this switch is the design of the scheme that protects MP1 by restricting maximum voltage appearing across its terminals.

Even though the prior art switch in FIG. 1 performs well for input signal levels that are within the supply range, it is useless when the input signal exceeds the supply voltage. The reason is the following: When the switch is turned on, input voltage appears at the gate of transistor MP1. As mentioned previously, this is necessary in order to restrict the gate-to-source voltage of this device to $V_{DD}$. Since switch MP2 is a PMOS transistor, if its drain voltage exceeds the supply voltage (because the input signal is greater than $V_{DD}$), the parasitic drain-substrate diode of this device will be forward biased, which will yield a huge current flow through the path formed by transistors MN2 and MN3, and the parasitic body diode of transistor MP2. This current path renders the prior art bootstrapped switch useless for applications where input signal level exceeds supply voltage. The body diode that would be activated here is that between the drain D of transistor MP2 and the bulk B of transistor MP2, shown in FIG. 2. A cross-section of transistor MP2, shown in FIG. 2, includes p type region p; n type region n; drain D; gate G; source S; and bulk B.

SUMMARY OF THE INVENTION

A bootstrapped switch for sampling inputs with a signal range greater than supply voltage includes: a bootstrapped switch coupled between an input node and an output node; a first transistor having a first end coupled to a control node of the bootstrapped switch, and having a backgate coupled to a second end of the first transistor; a first capacitor having a first end coupled to a second end of the first transistor; a second transistor coupled between the first end of the first transistor and a supply node, and having a control node coupled to a first clock signal node; a third transistor coupled between the second end of the first transistor and the supply node; a charge pump having an output coupled to a control node of the third transistor; a level shifter having a first output coupled to a second end of the first capacitor; a fourth transistor coupled between the supply node and a control node of the first transistor; a fifth transistor having a first end coupled to a control node of the fourth transistor and a second end coupled to the output of the charge pump, having a control node coupled to the supply node, and having a backgate coupled to the second end of the fifth transistor; a sixth transistor coupled between the first end of the fifth transistor and a common node, and having a control node coupled to the first clock signal node; a seventh transistor coupled between the input node and the control node of the first transistor, and having a control node coupled to the first clock signal node; an eighth transistor coupled between the input node and the control node of the first transistor, and having a control node coupled to the control node of the bootstrapped switch; and a ninth transistor coupled between the first end of the first transistor and the common node, and having a control node coupled to the second clock signal node.

DETAILED DESCRIPTION OF PREFERRED EMBODIMENTS

A bootstrapping circuit, according to the present invention, enables the precise sampling of input signals larger than the chip supply voltage with minimal power consumption overhead. The bootstrapped switch enables extending the range of low power SAR ADCs beyond supply voltage enabling a greater dynamic range, while minimizing power consumption. This is very useful in highly integrated power management applications where multi-channel SAR ADCs are utilized to measure off-chip voltage quantities that could well exceed the supply voltage. The prior art bootstrapped switches cannot be used to sample voltage inputs greater than the supply voltage, without suffering from huge power losses due to parasitic body diodes that get forward biased as the input exceeds the supply. This solution is cost-effective to fabricate and does not introduce any more stresses on the devices than a standard bootstrapping switch would.

Power consumption is minimized in the present invention since the switch consumes no static power and suffers from no parasitic body diodes that get turned on when the input voltage exceeds the supply voltage. Prior art bootstrap switches suffer from huge currents through drain-bulk body diode junctions which render them useless for sampling input signals that exceed the supply voltage.

The bootstrapped switch, according to the present invention, operates with minimal power consumption since no static currents are needed to keep the switch operational. Furthermore, all body diode junctions in the switch are reverse biased for the entire input voltage range including voltages that are greater than the supply voltage. Prior art bootstrapped switches (for example, the type used in pipelined ADC Converters) would suffer from forward biased body diode junctions in the event of feeding an input signal greater than the supply voltage. Furthermore, the present invention has a constant Vgs (gate to source voltage) drive of the bootstrapped switch over the entire range of the input signal enhancing the switch's bandwidth capabilities.

Figure 3:
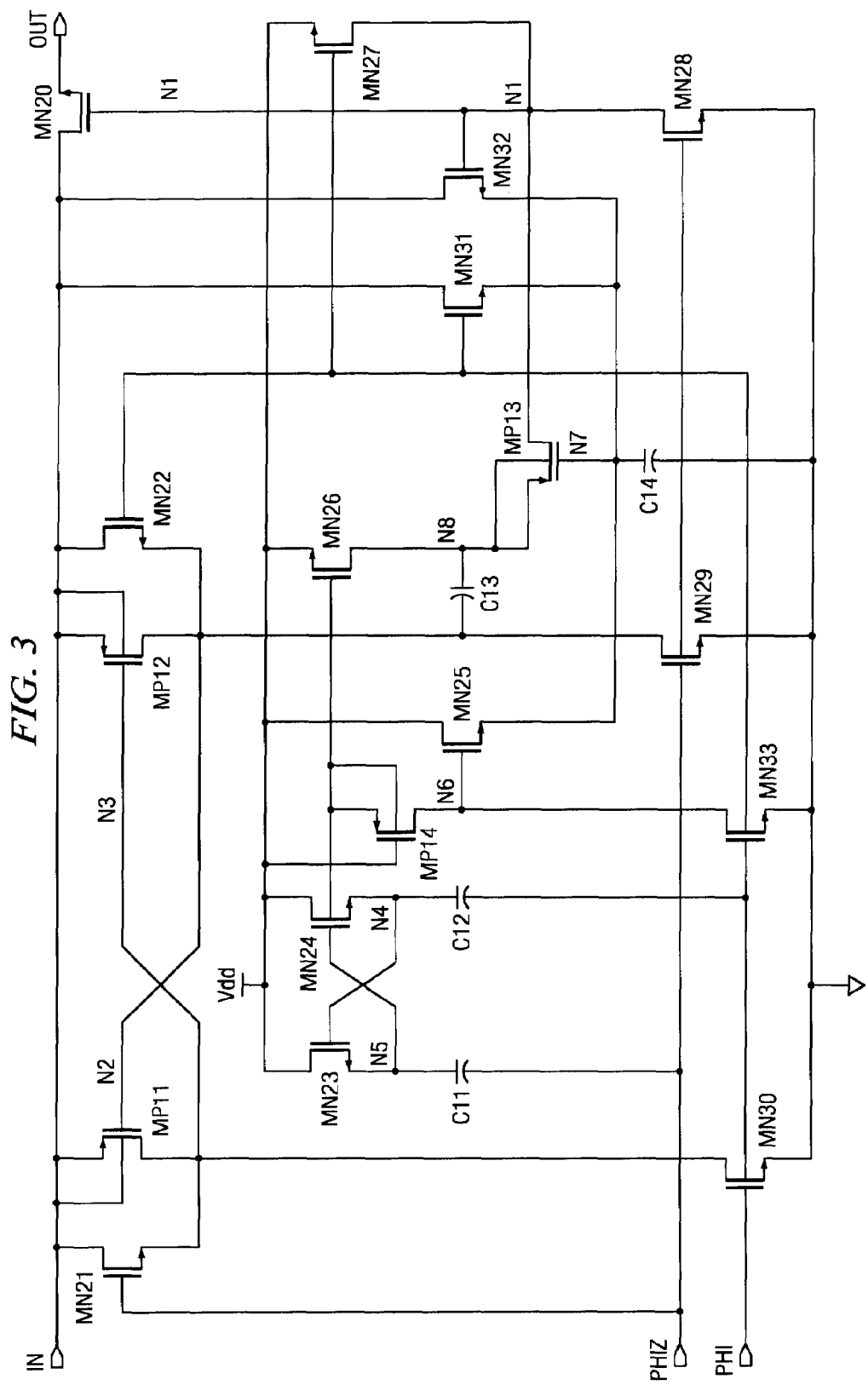
FIG. 3 is a circuit diagram of a preferred embodiment bootstrapping circuit, according to the present invention.

FIG. 3 shows a preferred embodiment bootstrapping circuit according to the present invention. The circuit of FIG. 3 includes NMOS transistors MN20-MN33; PMOS transistors MP11, MP12, MP13, and MP14; capacitors C11-C14; supply node $V_{DD}$; input node IN; clock signals PHI and PHIZ; and output node OUT. The bootstrapped switch is NMOS transistor MN20 that is connected to the output node OUT. Clock signal PHIZ is clock signal PHI inverted. Capacitor C13 is the clock-bootstrapped capacitor. Transistors MN23 and MN24, and capacitors C11 and C12 form a charge pump.

Transistors MP11, MP12, MN21, MN22, MN29, and MN30 form a simple level shifter. This level shifter is used in digital designs when it is necessary to convey a logic signal to a digital block having different power supply level. When the differential logic signals PHI and PHIZ are applied to transistors MN30 and MN29, the positive feedback created by PMOS transistors MP11 and MP12 forces one of the nodes N2 or N3 to go to ground and the other to go to input voltage level Vin. The transistors MN21 and MN22 are used to guarantee this behavior when the input signal level is very low (close or equal to the threshold voltage of transistor MP11 and MP12). If the input signal is low, there isn't enough gate over-drive for transistors MP11 and MP12 to switch the state of the level shifter. In this case transistor MN21 or MN22, driven by the clock signals, will act as a switch and drive the appropriate output node to the input voltage. To prevent meta-stable condition, transistors MN29 and MN30 should be designed much stronger than transistors MP11 and MP12. This level shifter operates such that nodes N2 and N3 change between ground and Vin, at alternate phases.

The switch operates as follows: The operation of the charge-pump formed by transistors MN23 and MN24, and capacitors C11 and C12, is explained above for the prior art switch of FIG. 1. Hence, capacitors C11 and C12 are charged to source voltage $V_{DD}$ after one clock period once the clock is applied; and node N4 and node N5 change between $V_{DD}$ and $2V_{DD}$ at alternate phases. It is obvious from the schematic that when node N5 goes to $2V_{DD}$ (when clock signal PHIZ goes high) to turn on MN26, node N2 is grounded (because transistor MN29 is on), hence capacitor C13 is also charged to source voltage $V_{DD}$.

Before analyzing the operation of the bootstrapped switch, the circuit formed by transistors MP14, MN25, and MN33 is described. Notice that the source terminal of MP14, together with its bulk terminal, is connected to node N5, hence it changes between voltage levels $V_{DD}$ and $2V_{DD}$. Since the gate terminal of transistor MP14 is connected to source voltage $V_{DD}$, when node N5 goes to $2V_{DD}$ (clock signal PHIZ goes high), transistor MP14 turns on and since for this case transistor MN33 is off, node N6 is charged to voltage $2V_{DD}$ to turn on transistor MN25. At the alternate phase, the gate to source voltage of transistor MP14 is zero, hence it is off, and since transistor MN33 is on, node N6 is drained to ground and consequently transistor MN25 is off. In short, node N6 changes between voltage level $2V_{DD}$ and 0. Notice that even though the gate to source voltage of transistor MN33 is less than or equal to source voltage $V_{DD}$, the drain to gate voltage of this device can go twice as high. Therefore, it is necessary to protect this device from over voltage stress. This can be achieved with either using a cascode device, exactly like transistor MN5 in FIG. 1 or transistor MN33 has to be chosen as a drain extended device.

Now the main bootstrapped switch is described. During off phase (clock signal PHIZ is high), transistor MN28 is on, therefore node N1 is at ground and the switch is off. Node N5 is at voltage $2V_{DD}$, hence transistor MP14 is on, therefore transistor MN25 is on driving node N7 to voltage $V_{DD}$. Transistor MN29 is on hence the bottom plate of capacitor C13 is at ground and transistor MN26 is on charging the top plate of capacitor C13, i.e., node N8, to $V_{DD}$. Since node N7 and N8 are both at $V_{DD}$, transistor MP13 is off. And finally, transistors MN31, MN32, and MN27 are all off.

At the beginning of the on phase of the switch, transistor MN27 begins charging node N1 until it reaches to voltage $V_{DD}-V_{T(MN27)}$ (where $V_{T(MN27)}$ is the threshold voltage of transistor MN27). From this point on, transistor MN27 is off since it doesn't have enough gate overdrive to conduct. Furthermore, when the charge stored on capacitor C13 takes over and drives node N1 to voltage $V_{DD}+V_{IN}$, transistor MN27 is completely turned off.

With the rising edge of the clock signal PHI, node N2 is pushed to input voltage $V_{IN}$; since capacitor C13 is already charged to source voltage $V_{DD}$, the top plate of capacitor C13, i.e., node N8, goes to voltage $V_{DD}+V_{IN}$ and the charge on capacitor C13 passes through transistor MP13 to charge node N1. There are two distinct mechanisms that turn transistor MP13 on by forcing node N7 to input voltage $V_{IN}$ in three different input signal regions:

1. When input signal is within the voltage range $V_{DD}-V_{T(MN31)}<V_{IN}$ (where $V_{T(MN31)}$ is threshold voltage of transistor MN31), transistor MN31 is always off (its drain voltage is equal to $V_{IN}$, its gate voltage is at $V_{DD}$ and its source voltage is initially at $V_{DD}$ and then at $V_{IN}$). For this case, transistor MP13 is turned on as follows: initially since transistor MN25 is turned off, node N7 is floating and it is at source voltage $V_{DD}$. When node N8 is pushed to voltage $V_{DD}+V_{IN}$, the voltage on node N7 increases because of the capacitive coupling from node N8 to N7 through the parasitic $C_{GS}$ (gate-to-source capacitance) of transistor MP13. The voltage on node N7 at the end of this transition can be expressed as:

$$V_{N7} = V_{DD} + \frac{C_{GS(MP13)}}{C_{GS(MP13)} + C_{14}} V_{IN}$$

Hence, the gate to source voltage of transistor MP13 can be expressed as:

$$V_{GS(MP13)} = \left(1 - \frac{C_{GS(MP13)}}{C_{GS(MP13)} + C_{14}}\right) V_{IN}$$

Since the input signal is large, by properly choosing the value of capacitor C14, it is possible to make voltage $V_{GS(MP13)}$ greater than the threshold voltage of transistor MP13 and turn it on. Once transistor MP13 is turned on, Capacitor C13 charges node N1 to voltage $V_{DD}+V_{IN}$, which turns on transistor MN20 to connect the input signal to the output, and at the same time transistor MN32 further drives node N7 to the input signal. Notice that transistor MP13 is protected from over voltage stress.

2. When the input signal is within the voltage range $0<V_{IN}<V_{T(MP13)}$, regardless of the value of capacitor C14, it is not possible to make the gate to source voltage of transistor MP13 greater than $V_{T(MP13)}$ using the transient on node N8, as it is clear from the above equation. But for this case, since the input signal is low enough, transistor MN31, driven by clock signal PHI, will turn on and drain node N7 from voltage $V_{DD}$ towards the input voltage. Furthermore, once transistor MP13 turns on and node N1 is charged to voltage $V_{DD}+V_{IN}$, transistor MN32 also turns on to force node N7 further towards the input signal level.

3. When the input signal is within the voltage range $V_{T(MP13)}<V_{IN}<V_{DD}-V_{T(MN31)}$, both of the mechanisms described above are active and drive node N7 to the input signal level.

Figure 1:
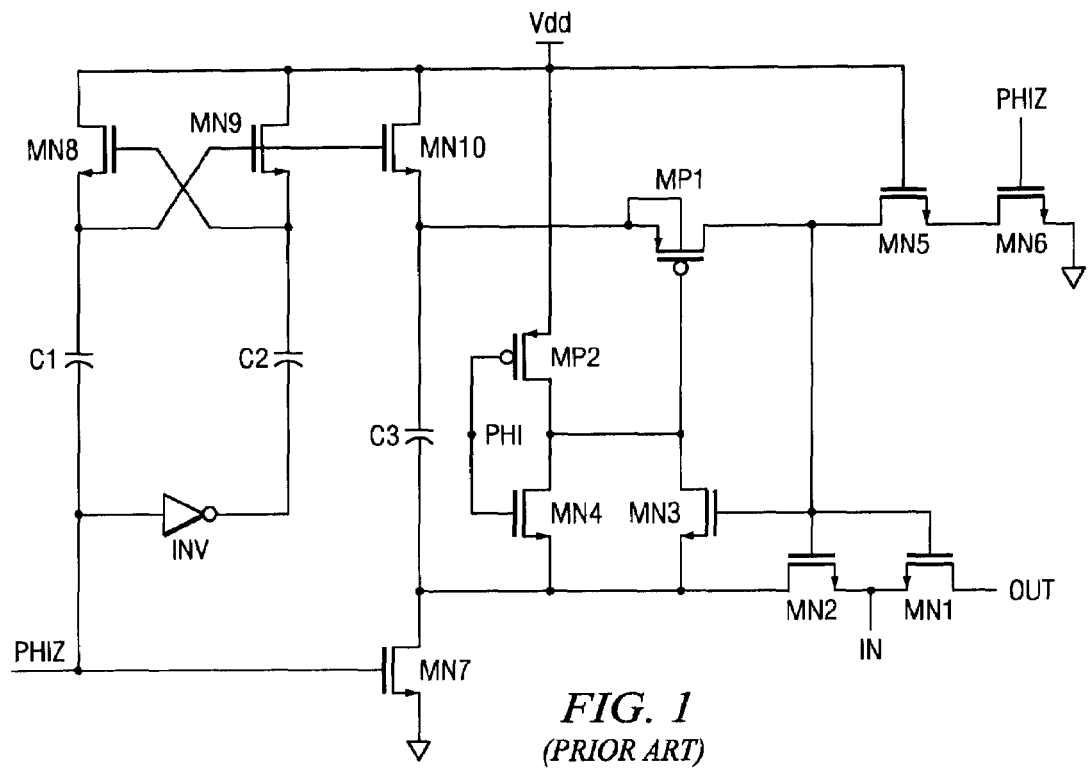
FIG. 1 is a circuit diagram of a prior art bootstrap circuit.
Figure 2:
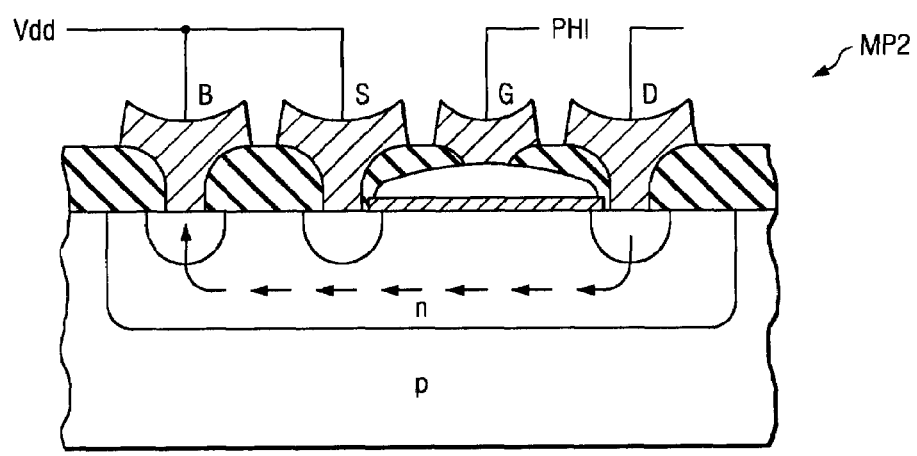
FIG. 2 is a cross-section of a transistor shown in FIG. 1.

One of the advantages of the present invention over the prior art circuit is the switch turn on time. Notice that the bottom plate of capacitor C3 in FIG. 1 is charged to the input voltage level through transistor MN2; but transistor MN2 itself is gradually turned on. Therefore, for fast turn on time, it is necessary to choose a large aspect ratio for transistor MN2, which results in a larger parasitic load on the gate terminal of transistor MN1 requiring a larger value for capacitor C3 to overcome charge losses to these parasitic capacitors. The present invention, shown in FIG. 3, on the other hand, charges the bottom plate of capacitor C13 directly to the input voltage. Furthermore, transistor MN27 helps at the beginning of the turn on transition for faster response. This extra speed can be very useful for a pipelined ADC system where the speed of the switch turn-on and turn-off is as important as its accuracy. The trade-off for this extra-speed is small shoot-through current flowing from the input node to ground through the level shifter circuit.

To easily understand the operation of this switch one needs to examine the state of the nodes in the switch before and after every timing event. There are two timing events associated with the operation of this switch: 1) PHI going from 0 to 1, which puts the switch in PHI=1 state, and 2) PHI going from 1 to 0, which puts the switch in PHI=0 state. With the initial condition for capacitors C11, C12, and C13 in mind, the state of the nodes in the switch for the PHI=0, and the PHI=1 states are examined below:

During PHI=0 state, transistor MP13 will be OFF because its $V_{gs}=V_{N7}-V_{N8}=0$, while its drain is at $V_{N1}=0$.

During PHI=0 state, transistor MP14 will be ON because its source is at $V_{N5}=2V_{DD}$ while its gate is at $V_{DD}$ which will charge node N6 to $2V_{DD}$ from the charge stored on capacitor C11.

During PHI=1 state, transistor MN27 starts charging node N1 until N1 reaches $V_{DD}-V_{tn}$, where $V_{tn}$ is the threshold voltage of an NMOS device. After that, transistor MN27 turns OFF either because node N1 goes to a value above $V_{DD}$ or there is not enough gate overdrive. After that point the circuit works such that the path through transistor MP13 takes over and drives node N1 to $V_{DD}+V_{in}$.

During PHI=1 state and for $V_{in}<V_{tp}$, where $V_{tp}$ is the threshold voltage of a PMOS device, transistor MP13 starts by being OFF because its $V_{gs}=V_{in}<V_{tp}$ (node N8=$V_{DD}$+$V_{in}$ while node N7 stays at $V_{DD}$ because of capacitor C14). Transistor MN31 will be turned ON pulling node N7 to $V_{in}$ which will turn ON transistor MP13 because $V_{gs}$ of MP13 becomes equal to $V_{DD}$ now. As MP13 turns ON the positive feedback loop provided by MN32 and node N1 will further connect node N7 to $V_{in}$ through transistor MN32.

During PHI=1 state and for $V_{in}>V_{DD}-V_{tn}$ transistor MN31 will always be OFF because its $V_{gs}<V_{tn}$ (its gate is at $V_{DD}$, its source is at $V_{in}>V_{DD}-V_{tn}$, while its drain is at $V_{DD}$ or $V_{in}$). As node N8 gets pushed to $V_{DD}$+$V_{in}$, the voltage on node N7 (initially a floating node charged to $V_{DD}$) will be determined by the capacitive division between capacitor C14 and the gate-source parasitic capacitance associated with transistor MP13. By increasing the size of capacitor C14, we guarantee that node N7 remains at roughly the same voltage, $V_{DD}$, even after the capacitive division. This will guarantee that transistor MP13 will turn ON to charge node N1, and the positive feedback through transistor MN32 will further guarantee that node N7 is charged to $V_{in}$.

During PHI=1 state and for $V_{tp}<V_{in}<V_{DD}-V_{tn}$, this is a mixture of the two cases explained in two items above.

A bootstrapped switch, according to the present invention, with an input range greater than the supply voltage is described above. Unlike traditional prior art bootstrapped switches the present invention suffers from no body diode problems for inputs greater than the supply voltage. The switch can be employed in a variety of applications where sampling of input signals beyond the supply voltage is needed (i.e. SAR ADCs, Pipelined ADCs, etc.). The switch maintains a constant $V_{gs}$ drive on the bootstrapped NMOS transistor for the entire input signal range, and requires only one phase of the system clock (i.e. no delayed phases required). Furthermore, the switch is easily manufacturable in standard CMOS technologies with high voltage CMOS capability or drain extended device capability.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bootstrapping circuit capable of sampling inputs beyond supply voltage comprising:
    a bootstrapped switch coupled between an input node and an output node;
    a first transistor having a first end coupled to a control node of the bootstrapped switch, and having a backgate coupled to a second end of the first transistor;
    a first capacitor having a first end coupled to the second end of the first transistor;
    a second transistor coupled between the first end of the first transistor and a supply node, and having a control node coupled to a first clock signal node;
    a third transistor coupled between the second end of the first transistor and the supply node;
    a charge pump having an output coupled to a control node of the third transistor;
    a level shifter having a first output coupled to a second end of the first capacitor;
    a fourth transistor coupled between the supply node and a control node of the first transistor; and
    a fifth transistor coupled between the output of the charge pump and a control node of the fourth transistor, and having a control node coupled to the supply node, and having a backgate coupled to the output of the charge pump.

2. The circuit of claim 1 further comprising a sixth transistor coupled between the control node of the fourth transistor and a common node, and having a control node coupled to the first clock signal node.

3. The circuit of claim 1 further comprising a second capacitor coupled between the control node of the first transistor and a common node.

4. The circuit of claim 2 further comprising a second capacitor coupled between the control node of the first transistor and the common node.

5. The circuit of claim 1 further comprising a sixth transistor coupled between the input node and the control node of the first transistor, and having a control node coupled to the first clock signal node.

6. The circuit of claim 4 further comprising a seventh transistor coupled between the input node and the control node of the first transistor, and having a control node coupled to the first clock signal node.

7. The circuit of claim 1 further comprising a sixth transistor coupled between the input node and the control node of the first transistor, and having a control node coupled to the control node of the bootstrapped switch.

8. The circuit of claim 5 further comprising a seventh transistor coupled between the input node and the control node of the first transistor, and having a control node coupled to the control node of the bootstrapped switch.

9. The circuit of claim 1 further comprising a sixth transistor coupled between the control node of the bootstrapped switch and a common node, and having a control node coupled to a second clock signal node.

10. The circuit of claim 8 further comprising an eighth transistor coupled between the control node of the bootstrapped switch and a common node.

11. The circuit of claim 1 wherein the level shifter comprises:
    a first level-shifter transistor coupled between the input node and the second end of the first capacitor; and
    a second level-shifter transistor coupled to the input node and cross-coupled with the first level-shifter transistor.

12. The circuit of claim 11 wherein the level shifter further comprises:
    a third level-shifter transistor coupled between the first level-shifter transistor and a common node, and having a control node coupled to a second clock signal node; and
    a fourth level-shifter transistor coupled between the second level-shifter transistor and the common node, and having a control node coupled to the first clock signal node.

13. The circuit of claim 11 wherein the level shifter further comprises:
    a third level-shifter transistor coupled in parallel with the first level-shifter transistor and having a control node coupled to the first clock signal node; and
    a fourth level-shifter transistor coupled in parallel with the second level-shifter transistor and having a control node coupled to a second clock signal node.

14. The circuit of claim 12 wherein the level shifter further comprises:
   a fifth level-shifter transistor coupled in parallel with the first level-shifter transistor and having a control node coupled to the first clock signal node; and
   a sixth level-shifter transistor coupled in parallel with the second level-shifter transistor and having a control node coupled to the second clock signal node.

15. The circuit of claim 13 wherein the first and second level-shifter transistors are PMOS transistors and the third and fourth level-shifter transistors are NMOS transistors.

16. The circuit of claim 1 wherein the bootstrapped switch is a transistor.

17. The circuit of claim 1 wherein the bootstrapped switch is an NMOS transistor, the first transistor and fifth transistor are PMOS transistors, and the second, third, and fourth transistors are NMOS transistors.

18. The circuit of claim 1 wherein the charge pump comprises:
   a first charge-pump transistor coupled to the supply node; and
   a second charge-pump transistor coupled to the supply node and cross-coupled with the first charge-pump transistor.

19. The circuit of claim 18 wherein the charge pump further comprises:
   a first charge-pump capacitor coupled between the first charge-pump transistor and the first clock signal node; and
   a second charge-pump capacitor coupled between the second charge-pump transistor and a second clock signal node.

20. The circuit of claim 19 wherein the control node of the third transistor is coupled to a control node of the first charge-pump transistor.

* * * * *